(12) United States Patent
Deshmukh et al.

(10) Patent No.: US 9,117,964 B2
(45) Date of Patent: Aug. 25, 2015

(54) PREPARATION OF SEMICONDUCTOR FILMS

(75) Inventors: Ranjan Deepak Deshmukh, Watertown, MA (US); Ralf Kuegler, Ludwigshafen (DE); Joerg J. Schneider, Seeheim-Jugenheim (DE); Rudolf Hoffmann, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 118 days.

(21) Appl. No.: 13/807,382

(22) PCT Filed: May 31, 2011

(86) PCT No.: PCT/EP2011/002691
§ 371 (c)(1),
(2), (4) Date: Dec. 28, 2012

(87) PCT Pub. No.: WO2012/000594
PCT Pub. Date: Jan. 5, 2012

(65) Prior Publication Data
US 2013/0102108 A1    Apr. 25, 2013

Related U.S. Application Data

(60) Provisional application No. 61/359,585, filed on Jun. 29, 2010.

(51) Int. Cl.
| | | |
|---|---|---|
| H01L 21/00 | (2006.01) | |
| H01L 31/18 | (2006.01) | |
| C23C 18/12 | (2006.01) | |
| H01L 21/02 | (2006.01) | |
| H01L 31/0296 | (2006.01) | |
| H01L 31/032 | (2006.01) | |

(52) U.S. Cl.
CPC ........ *H01L 31/1828* (2013.01); *C23C 18/1204* (2013.01); *C23C 18/1275* (2013.01); *C23C 18/1295* (2013.01); *H01L 21/02551* (2013.01); *H01L 21/02568* (2013.01); *H01L 21/02628* (2013.01); *H01L 31/0296* (2013.01); *H01L 31/032* (2013.01); *H01L 31/0322* (2013.01); *H01L 31/0324* (2013.01); *H01L 31/0326* (2013.01); *Y02E 10/541* (2013.01)

(58) Field of Classification Search
USPC ............................................. 438/95, 104, 102
See application file for complete search history.

(56) References Cited

U.S. PATENT DOCUMENTS

| | | |
|---|---|---|
| 7,829,059 B2 | 11/2010 | Guo et al. |
| 8,057,850 B2 | 11/2011 | Curtis et al. |
| 8,367,461 B2 | 2/2013 | Kuegler et al. |
| 2007/0156259 A1 | 7/2007 | Baramov et al. |
| 2008/0038558 A1 | 2/2008 | Landry et al. |
| 2008/0202383 A1 | 8/2008 | Shi |
| 2009/0235978 A1* | 9/2009 | Piber et al. ............... 136/252 |
| 2009/0280598 A1 | 11/2009 | Curtis et al. |
| 2010/0003187 A1 | 1/2010 | Guo et al. |
| 2010/0181564 A1* | 7/2010 | Kuegler et al. ............. 257/43 |
| 2012/0086002 A1 | 4/2012 | Fleischhaker et al. |

FOREIGN PATENT DOCUMENTS

| | | | |
|---|---|---|---|
| DE | 10 2007 043 920 | 1/2009 | |
| DE | WO 2009/010142 | * 1/2009 | ............. C23C 18/12 |
| JP | 2009541976 A | 11/2009 | |
| WO | WO-2008 021604 | 2/2008 | |
| WO | WO-2008 057119 | 5/2008 | |
| WO | WO-2010 146053 | 12/2010 | |

OTHER PUBLICATIONS

International Search Report for PCT/EP2011/002691, Date of the actual completion of the international search: Aug. 4, 2011, Date of mailing of the international search report: Aug. 19, 2011.
Repins, I. et al., "19.9%-efficient ZnO/Cds?CuInGaSe$^2$ Solar Cell with 81.2% Fill Factor," Progress in Photovoltaics: Research and Applications, 2008, vol. 16, pp. 235-239.
Hibberd, C. J. et al., "Non-vacuum methods for formation of Cu(In, Ga)(Se, S)$_2$ Thin Film Photovoltaic Absorbers," Progress in Photovoltaics: Research and Applications, 2009.
Kirillova, M. V. et al., "Diaquabis(2-hydroxyiminopropionato-$_K$$^2$N,O)Copper(II)," Acta Cryst., 2007, E63, pp. m1670-m1671.
Hillhouse, H. W. et al., "Solar cells from colloidal nanocrystals: Fundamentals, materials, devices, and economics," Current Opinion in Colloid & Interface Science, 2009, vol. 14, pp. 245-259.
Guo, Q. et al., "Development of CuInSe$_2$ Nanocrystal and Nanoring Inks for Low-Cost Solar Cells," Nano Letters, 2008, vol. 8, No. 9, pp. 2982-2987.
Hill, M. R. et al., "Towards new precursors for ZnO thin films by single source CVD: the X-ray structures and precursor properties of zinc ketoacidoximates," Inorganica Chimica Acta, 2005, vol. 358, pp. 201-206.
Yang, J. et al., "Preparation of mesoporous titania by surfactant-assisted sol-gel processing of acetaldoxime-modified titanium alkoxides," Journal of Non-Crystalline Solids, 2010, vol. 356, pp. 1217-1227.
Office Action for related Japanese Patent Application No. 2013-517050, Drafting Date: Jan. 8, 2015, Dispatching Date: Jan. 20, 2015 with English translation.

* cited by examiner

*Primary Examiner* — Jamie C Niesz
(74) *Attorney, Agent, or Firm* — Millen, White, Zelano & Branigan, P.C.

(57) ABSTRACT

The invention relates to a preparation process for thin semi-conducting inorganic films comprising various metals (Cu/In/Zn/Ga/Sn), selenium and/or sulfur. The process uses molecular precursors comprising metal complexes with oximato ligands. Copper-based chalcopyrites of the I-III-IV$_2$-type are prepared with high purity at low temperatures under ambient conditions. The thin films can be used in photovoltaic panels (solar cells).

13 Claims, 4 Drawing Sheets

PREPARATION OF SEMICONDUCTOR FILMS

This application claims benefit to U.S. Provisional Application 61/359,585 of Jun. 29, 2010.

The invention relates to a preparation process for thin semiconducting inorganic films comprising various metals (Cu/In/Zn/Ga/Sn), selenium and/or sulfur. The process uses molecular metal containing precursor complexes with oximato ligands. Copper-based chalcopyrites of the I-III-VI$_2$-type are prepared with high purity at low temperatures in inert atmosphere. The thin films can be used in photovoltaic panels (solar cells).

Photovoltaic panels are normally made of either crystalline silicon or thin-film cells. Many currently available solar cells are configured as bulk materials that are subsequently cut into wafers and treated in a "top-down" method of synthesis, with silicon being the most prevalent bulk material. In an attempt to make cheaper panels, other materials are configured as thin-films (inorganic layers, organic dyes, and organic polymers) that are deposited on supporting substrates.

I-III-VI$_2$-type copper-based semiconductors (chalcopyrite-type) like CuInSe$_2$ (CIS), CuIn(S$_y$,Se$_{1-y}$)$_2$ (CISS), CuIn$_x$Ga$_{1-x}$(Se$_y$,S$_{1-y}$)$_2$ (CIGS) are being widely studied semiconductors as an absorber layer for thin film solar cells. CISS and CIGS have a direct bandgap that is tunable by varying the In/Ga ratio or by varying the S/Se ratio to match the solar spectrum. Another advantage of CIGS is the lower environmental impact due to much lower cadmium content over the competing CdTe devices. Recently single-junction laboratory scale CIGS solar cells have been demonstrated to reach 19.9% power conversion efficiency, higher than CdTe (16.5%) or a-Si (12%) based devices (I. Repins et al., Prog. Photovoltaics, 2008, 16, 235).

The state of the art CIGS devices are made from vacuum processes such as the 3-stage co-evaporation of metals deposited under a selenium source in the chamber. Despite the high efficiencies at the lab-scale, a big disadvantage of the vacuum processes is that they usually require a selenization step which is done under a toxic environment of Se or H$_2$Se gas. The selenization step is not trivial and creates difficulties in scaling up to industrial processes. The co-evaporation process also poses difficulties in controlling film properties over large area substrates. The challenge involved in the vacuum process is the high control requirement for flux/deposition rate in order to avoid formation of intermediate compounds and to obtain controlled stoichiometry. Poor control of film properties over large area substrates adversely affects the device performance. Low material utilization of evaporated CIGS also increases costs as a part of the evaporated material ends up on the walls of the chamber. The formation of CIGS requires high temperature in excess of 500° C. increasing thermal costs and making this process challenging for flexible and light weight substrates such as plastics. To address the above challenges there is a need for alternate methods of CIGS deposition. (see "Non-vacuum based methods for formation of Cu(In, Ga)(Se, S) thin film photovoltaic absorbers", C. J. Hibberd et al. Prog. Photovolt: Res. Appl., 2009, preview)

The solution based processes are highly advantageous over the vacuum based as they can be used for roll-to-roll mass production with high throughput and significant cost reduction by 100% material utilization. Solution based precursors can be used to deposit absorber layers by dip coating, spray coating, spin coating, slit coating, drop casting, doctor blading, ink-jet printing or flexographic/gravure printing etc. Recently a solution deposition method of CISS and CIGS based on hydrazine precursors from IBM was demonstrated. (US 20090145482A1, US 20090121211, WO 1997023004; Liu et al. Chem. Mater., 2010, 22, 1010-1014; Mitzi et al. Adv. Mater., 2008, 20, 3657). The process involved dissolution of compounds such as Cu$_2$S, S; In$_2$Se$_3$, Se; Ga, Se with excess S or Se in hydrazine; deposition of the precursor on a substrate followed by annealing step to convert the precursor to CISS or CIGS. The process was free of selenization step however utilized high temperatures of 450-550° C. Another disadvantage of this method is that hydrazine is highly toxic and flammable making handling in large quantities a safety concern. In a similar approach ethylene diamine precursors are used by dissolving Cu$_2$Se or In$_2$Se with Se and ethylene diamine (WO 2008063190, WO 2008057119) in order to make Cu$_2$Se/CuInSe$_2$ films. However photovoltaic device efficiencies have not yet been reported by this approach.

Spray pyrolysis is another solution based technique where metal salts like CuCl, InCl$_3$, GaCl$_3$ with selenourea and their derivatives are dissolved in a solvent are sprayed on a hot substrate to produce CIS, CISS or CIGS films. However this approach has resulted in low efficiencies due to unacceptably high impurity levels of C, Cl and oxide phases. (C. J. Hibberd Prog. Photovolt: Res. Appl., 2009; WO 8810513; JP 3068775A)

Another promising alternative is the use of molecular inorganic precursors which can be decomposed to form metal chalcogenides. (JP 01-298010 A, JP 2001274176, JP 11004009 A). However a generic problem with most precursors is that they can leave a residue of unwanted elements like C, O, N etc. after decomposition that can affect the device performance adversely.

The present invention relates to a mixture of molecular inorganic precursors and a molecular or elemental chalcogen source that can be decomposed cleanly by heating without leaving any significant impurity content to form a semiconductor and the incorporation into a working photovoltaic device as a thin film.

Here we are using complexes of copper, indium and/or optionally other metals with oximato ligands (2-hydroximinoalkanoates or 2-alkoximinoalkanoates) as precursors for a film deposition method. These films are semiconductors and applicable as active elements in photovoltaic devices.

Surprisingly, a process has now been developed in which a combination of precursor material including one or more molecular inorganic precursors and a chalcogen source (chalcogen=Se, S, Te) is applied to surfaces and subsequently converted into the electrically active, i.e. conductive, semiconducting and/or insulating material at low temperatures.

In one aspect of the invention a process for the production of a semiconductor is presented, which is characterised in that
a. precursors comprising one or more metal complexes and a chalcogen source are combined, at least one metal complex comprising at least one ligand from the class of the oximates, and
b. the combined precursors are decomposed preferably in an inert environment, by heating or radiation with formation of the semiconductor.

The chalcogen source according to this invention is limited to sulfur (S), selenium (Se) and to some degree tellurium (Te) sources. Oxide phases are usually less desirable as they are rarely semiconducting.

Preferably two or all of the metal precursors comprise one or more ligands from the class of the oximates. One or more of the metals can be employed as known precursors, including e.g. acetylacetonates, acetates and other salts, which are preferably free of halogenides. The metal complexes are preferably metal oximato complexes comprising the maximum number of oximato ligands depending from their valency, more preferably two or three oximato ligands. Typical metals which are preferably used as oximates include copper, indium, gallium, zinc or tin.

The semiconductors formed in the process are preferably of the I-III-VI$_2$ type, of the I-VI type, of the II-VI type, of the III-VI type, of the IV-VI-type and more preferably of the I-III-VI$_2$ type. For the I-III-VI$_2$ type semiconductors two or more metal precursors are used. The monovalent metal is preferably copper. The trivalent metals are preferably indium or gallium. Mixtures of these metals can be employed. Additionally, the tervalent metal can be exchanged partly or completely against a mixture of divalent and tetravalent metals (I-II-IV-VI$_2$-type semiconductor, e.g. CuZnSnSe$_2$, CuZnGeSe$_2$). Divalent metals are preferably cadmium or zinc, tetravalent metals are preferably germanium or tin.

The precursors are preferably combined in a liquid phase, preferable a solvent providing good solubility of the components, and thus complete mixing of the metals with the chalcogen source is assured. Usually the solvent evaporates quickly when the mixture is applied to a substrate and heated to at least above the boiling point of the solvents. Accordingly, in step (b) of the process described above the decomposition is optionally preceded by the evaporation of any solvents. The inert environment for decomposition usually is inert gas, like nitrogen or argon.

The precursor mixture is preferably deposited on a substrate prior to decomposition, preferably by dip coating, spray coating, spin coating, slit coating, drop casting, doctor blading, ink-jet printing or flexographic/gravure printing. Rapid evaporation and decomposition is preferred. In one preferred aspect of the invention the semiconductor is made by spray pyrolysis.

In another aspect of the invention, it also relates to a precursor mixture for deposition of electronic components, characterised in that it comprises at least one metal complex which contains at least one ligand from the class of the oximates. Preferably it is free from alkali and alkaline-earth metals or halogen (especially chloride). The precursor mixture preferably is a solution of the metal oximates and chalcogen source in a liquid carrier. The molecular precursors are highly soluble materials, but the precursor mixture can also comprise additionally suspended small particles of additional compounds. When metal precursors are combined together with a chalcogen source of selenium or sulfur, metal chalcogenide can be produced upon thermal decomposition of the mixed precursors.

In the inventive process no oxides are produced. The semiconductor materials consist to almost pure selenide/sulfide phases of the metals. The level of impurities of the elements O/C/N/Cl is considerable lower than observed with methods according to prior art.

The term "free from alkali and alkaline-earth metals" means that the alkali or alkaline-earth metal content in the metal complexes prepared is less than 0.2% by weight.

The preparation of alkali metal-free starting compounds is crucial for use in electronic components since residues containing alkali metals and alkaline-earth metals have an adverse effect on the electronic properties. These elements act as foreign atoms in the crystal and may have an unfavourable influence on the properties of the charge carriers.

In a preferred embodiment, the precursor mixture comprises a liquid phase containing the precursor materials. The liquid phase can easily be processed by transferring it to surfaces to be covered with semiconducting material by spraying, dropping, dipping, printing etc. The liquid phase may preferably comprise organic solvents, more preferably solvents in which the precursors are soluble, mostly preferred polar-aprotic solvents like dimethylformamide (DMF), dimethyl sulfoxide (DMSO), etc and protic solvents like methanol, ethanol, 2-methoxyethanol etc.

As already described above, the metal complex precursor comprises at least one ligand from the class of the oximates. It is preferred in accordance with the invention for one or more of the ligands of the metal complex to comprise a 2-(methoxyimino)alkanoate, 2-(ethoxyimino)alkanoate or 2-(hydroxyimino)alkanoate, more preferably the ethanoate, propanoate or butanoate within (C$_2$— to C$_8$—) alkanoates, with the propanoates preferred most.

The class of oximates according to the current invention is comprised by 2-oximino carboxylic acids, their derivates by variation of R$^1$ and R$^2$, and corresponding anions. A general structure of a preferred oximato ligand as referred to above and below is of the following formula:

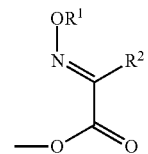

wherein R$^1$ is selected from H, CH$_3$ or CH$_2$CH$_3$, and R$^2$ is selected from H, C$_1$ to C$_6$ alkyls, phenyl or benzyl, preferably H, CH$_3$ or CH$_2$CH$_3$. The oximato ligand usually is a chelate ligand with one negative charge. As a chelate ligand it bonds to the metal via the N and one of the O atoms.

The copper precursor is preferably a Cu(II) bisoximato complex. The indium precursor is preferably a Indium(III) trisoximato complex. The gallium complex is preferable a Ga(III) trisoximato complex.

Typical preferred precursors are for example described below (Scheme 1, 2)

Scheme 1. Structure of copper precursor 1

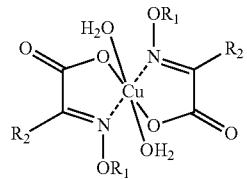

For precursor 1, R$_1$ or R$_2$ can be chosen from H, CH$_3$, C$_2$H$_5$, etc., for example, the complex with R$_1$=H and R$_2$=CH$_3$ would be called bis[2-(hydroxyimino)propanoato] copper with two water molecules of hydration.

Scheme 2. Structure of indium precursor 2

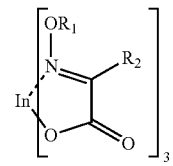

For precursor 2, R$_1$ or R$_2$ can be chosen from H, CH$_3$, C$_2$H$_5$, etc. For example, the complex with R$_1$=CH$_3$ and R$_2$=CH$_3$ would be called tris[2-(methoxyimino)propanoato]

indium. The gallium precursor has the same structure as the indium by exchanging the metals.

The oximato based metal precursors are stable in air and can be easily dissolved in common organic solvents such as methanol, ethanol, 2-methoxyethanol, DMF, DMSO etc.

The thermal decomposition temperature of these metal precursors is as low as 150° C. and the end product after decomposition contains very low amounts of impurity elements like C, N (<1%). The precursors when individually decomposed produce metal oxides. For example, thermal decomposition of indium precursor produces indium oxide when decomposed in air. With the process according to the invention oxide formation is prevented by addition of at least equivalent amounts of selenium or sulfur in a suitable form.

Some of the metal precursors from the class of oximates are known from literature and can be prepared as previously described. Preferably a synthesis using low levels of halogenides is applied, e.g. by exchanging the metal salts, often halogenides, into metal nitrates, sulfates, acetates or else. For the preparation of a metal precursor an oxocarboxylic acid (preferably pyruvic acid) is reacted with at least one hydroxylamine or alkylhydroxylamine in the presence of an alkali metal-free base, and an inorganic metal salt, such as, for example, a nitrate, is subsequently added. This way, first the oximato ligands are synthesised by condensation of alpha-keto acids or oxocarboxylic acids with hydroxylamines or alkylhydroxylamines in the presence of bases in aqueous solution. Then, the metal precursors form at room temperature by addition of a metal salt, such as, for example, metal chloride or nitrate.

The oxocarboxylic acids employed can be of varying chain length, but $C_2$-$C_6$ carboxylic acids are preferred. Preference is given to the use of oxoacetic acid, oxopropionic acid (pyruvic acid) or oxobutyric acid.

The alkali metal-free base employed is preferably alkylammonium hydrogencarbonate, alkylammonium carbonate or alkylammonium hydroxide. Particular preference is given to the use of tetraethylammonium hydroxide or tetraethylammonium bicarbonate. These compounds and the by-products forming therefrom are readily soluble in water. They are thus suitable on the one hand for carrying out the reaction for the preparation of the precursors in aqueous solution, and on the other hand the by-products forming can easily be separated off from the precursors by recrystallisation or transferring into an organic solvent.

The semiconductor layer typically has a thickness of 15 nm to 3 μm, preferably 30 nm to 2 μm. The layer thickness is dependent on the coating technique used in each case and the parameters thereof. In the case of spin coating, these are, for example, the speed and duration of rotation. In the case of spraying, the thickness can be increased with spraying time.

In accordance with the invention, the substrate can be either a rigid substrate, such as glass, ceramic, metal or a plastic substrate, or a flexible substrate, in particular plastic film or metal foil. In accordance with the invention, preference is given to the use of a substrate coated with molybdenum, which is very effective for the performance of solar cells.

The present invention furthermore relates to a process for the production of electronic structures, preferably layered semiconductors, more preferably a photovoltaic device, which is preferably a thin film photovoltaic device, characterised in that a) the precursor mixture according to the invention is applied to a substrate in a layered manner, optionally one or more times, corresponding to the electronic structure to be achieved, preferably by dip coating, spray coating, spin coating, slit coating, drop casting, doctor blading, ink-jet printing or flexographic/gravure printing, b) calcination and/or drying of the applied precursor layer with formation of a semiconductor layer or surface, and c) optionally supplying the applied electronic structure with additional layers and/or contacts.

Steps a9 and b9 can be performed condurrently by e.g. spraying on a hot substrate (spray pyrolysis).

This process produces semiconducting components and optionally the connections of the components in a electronic structure. The electronic structure can be part of a solar device, wherein the absorber layer comprises the produced semiconductor Applying the precursor mixture onto the substrate by processes such as dip coating, spray coating, spin coating, slit coating, drop casting, doctor blading, ink-jet printing or flexographic/gravure printing is achieved analogous to methods familiar to the person skilled in the art (see M. A. Aegerter, M. Menning; Sol-Gel Technologies for Glass Producers and Users, Kluwer Academic Publishers, Dordrecht, Netherlands, 2004), where spin coating or spray coating is preferred in accordance with the invention.

In a preferred embodiment of the invention the absorber layer in a photovoltaic device is fabricated by depositing the mixture of one or more, preferably two precursors and a chalcogen source dissolved in a suitable organic solvent onto a substrate and thermally decomposing the precursors to obtain the semiconductor layer. For example a copper precursor and an indium precursor are co-deposited with selenium and heated in an inert environment afterwards in order to obtain a CIS layer.

The oximato precursors are quite versatile and can be prepared with various metals including copper, indium, gallium, tin, zinc etc. Thus, this invention based on oximato precursors extends to form as material CIS, CISS, CIGS, CZTS (copper zinc tin selenides and/or sulfide) and other chalcogenides like copper selenide (I-VI), copper sulfide (I-VI), zinc selenide (II-VI), zinc sulfide (II-VI), indium selenide (III-VI), indium sulfide (III-VI), gallium selenide (III-VI), gallium sulfide (III-VI), tin selenide (IV-VI), tin sulfide (IV-VI), etc.

When two or more metals are used for the process, the precursor mixture comprises relative amounts of the oximato metal precursors which are equivalent to the stoichiometry of the desired semiconductor. For a pure CIS layer equimolar amounts of copper and indium precursor would be employed. The copper and indium precursor ratios can also be adjusted to make either slightly copper poor or copper rich CIS layer. Slightly copper poor CIS compositions have been shown in literature to have better photovoltaic performance.

The chalcogen (selenium and/or sulfur) source is preferably selected from selenourea/thiourea or their derivatives, thioacetamide, or Se/S powder dissolved in amines like hydrazine, ethylenediamine, ethanolamine etc.; phosphines like tributylphosphine, trioctylphosphine, triphenylphosphine, etc. or other suitable carriers.

The precursor mixture comprises an amount of the chalcogen component relative to the amount of metal which is equivalent to the stoichiometry of the desired semiconductor or more. Preferably an excess amount of the chalcogen is used, because some of the selenium or sulfur may be lost due to the chalcogen volatility during annealing and decomposing the precursor mixture. The amount of chalocogen is preferably 100% (stoichiometric, 0% excess) to 400% (300% excess) relative to the theoretical metal content, more preferably 10-150% excess.

The precursor mixture can be used as an ink which can be dip coated, spray coated, spin coated, slit coated, drop casted, doctor bladed, ink-jet printed or flexographic/gravure printed on any substrate. Substrates include for example glass, metal foil or plastic.

The precursor mixture can be deposited on a "hot" substrate to decompose the precursor in-situ to form a semiconductor layer. This method, referred to as spray pyrolysis, prevents crystallization of single species from the mixture prior to decomposition while the liquid carrier evaporates. The produced materials or layers may have a more homogeneous spatial distribution of the elements.

Another method to produce the semiconductor material or the absorber layer is to deposit the precursor solution onto a substrate held at a temperature below the temperature of decomposition, typically at room temperature. This step is followed by annealing the films preferably in inert environment at the decomposition temperature of the precursors to convert the precursor films to semiconductor layer, e.g. a CIS layer. An intermediate step can be the evaporation of the liquid carrier. This method provides more time to evenly distribute the precursor mixture in the required form or thickness onto a substrate.

In a third embodiment of the method the precursor mixture is spray dried into hot inert gas providing a fine powder or grains of the semiconductor.

The thermal conversion of the metal complex precursor into the functional semiconductor layer is carried out at a temperature ≥80° C., preferably ≥120° C. and more preferably ≥150° C. The temperature is preferably between 150 and 450° C. The residue after decomposition does not contain any significant carbon contamination (<1%). The first decomposition step can be followed by further annealing steps to improve the electronic properties and crystallinity and/or grain size of the semiconductor, preferably the layer of semiconductor (more preferably CIS or CIGS layer). The grain size of the semiconductor film can be increased by increasing the annealing temperature and annealing time. No intermediate phases (which are detrimental to the PV performance) are formed if the precursors are completely decomposed. No additional high temperature selenization or sulfurization step above 250° C. (i.e annealing the films in chalcogen vapour) is required for the formation of the semiconductor film. Therefore in one preferred embodiment of the invention the process for the manufacture of a photovoltaic device according to the invention is free of any additional selenization and/or sulfurization step at temperatures above 250° C. This way the temperatures in a process can be kept at 200° C. or lower.

On the other hand, annealing and selenization may still provide improved device performance due to other effects than precursor decomposition. Grain size and grain boundaries can be optimized at high temperatures, while extra chalcogen (usually Se) is optionally supplied in the gas phase at these temperatures in order to keep its contents stable. Therefore in another preferred embodiment of the invention the inventive process according to the invention includes as a further step a selenization and/or sulfurization step and/or an annealing step after the decomposition of the precursors. The amount of chalcogen in the annealed films can be controlled by the initial chalcogen content in the precursor solution and by the annealing/decomposition temperature and time.

The conversion of the metal complex precursor or the precursor mixture into the functional semiconductor layer is carried out in a further preferred embodiment by irradiation, preferably electromagnetic irradiation, including microwaves, IR, and UV, with preference to UV light at wavelengths <400 nm. The wavelength is preferably between 150 and 380 nm. The advantage of UV irradiation is that the layers produced thereby have lower surface roughness.

The electronic component is provided with contacts and completed in a conventional manner. For photovoltaic devices a transparent top electrode made from e.g. ZnO or indium-tin oxide and a metal grid is provided.

The present invention furthermore relates to the use of the metal complex or precursor mixture according to the invention for the production of one or more functional layers, preferably the absorber layer, in a photovoltaic device.

The following abbreviations are used above and below:
PCE power conversion efficiency,
FF fill factor,
$V_{OC}$ open circuit voltage,
$J_{SC}$ short circuit current density,
DMF N,N-dimethylformamide, a solvent.

The following examples are intended to illustrate the present invention. However, they should in no way be regarded as limiting.
Preparation of the Metal Precursors:

1) Preparation of the copper precursor
bis[2-(hydroxyimino)-propanoato]copper

The compound is prepared according to M. V. Kirillova et al. *Acta Cryst.* (2007) E63, m1670-m1671 by treating a methanolic solution of Cu(II)nitrate with N-hydroxy-2,2'-iminodipropionic acid.

2) Preparation of the indium precursor
tris-[2-(methoxyimino)propanoato]indium

Sodium hydrogencarbonate (1.68 g, 20 mmol) is added in small portions with stirring to a solution of sodium pyruvate (2.20 g, 20 mmol) and methoxylamine hydrochloride (1.67 g, 20 mmol) in 50 ml of water. When the visible evolution of gas is complete, the mixture is stirred for a further 30 min. The mixture is subsequently evaporated to complete dryness in a rotary evaporator. A solution of anhydrous indium chloride (1.95 g, 6.6 mmol) in 125 ml of methanol is added to the white powder obtained in this way, and the mixture is stirred for 2 h. The solution is filtered and evaporated to dryness in a rotary evaporator. The residue is taken up in 100 ml of dichloromethane, and the suspension obtained in this way is refiltered. The product is subsequently precipitated from the filtrate using copious n-hexane, filtered off and dried in a desiccator. The compound obtained in this way can be characterised by IR and NMR spectroscopy.

3) Preparation of the gallium precursor
tris-[2-(methoxyimino)propanoato]gallium Sodium hydrogencarbonate (1.68 g, 20 mmol) is added in small portions with stirring to a solution of sodium pyruvate (2.20 g, 20 mmol) and methoxylamine hydrochloride (1.67 g, 20 mmol) in 50 ml of water. When the visible evolution of gas is complete, the mixture is stirred for a further 30 min. The mixture is subsequently evaporated to complete dryness in a rotary evaporator. A solution of gallium nitrate hexahydrate (2.40 g, 6.6 mmol) in 125 ml of methanol is added to the white powder obtained in this way, and the mixture is stirred for 2 h. The solution is filtered and evaporated to dryness in a rotary evaporator. The residue is taken up in 100 ml of dichloromethane, and the suspension obtained in this way is refiltered. The product is subsequently precipitated from the filtrate using copious n-hexane, filtered off and dried in a desiccator. The compound obtained in this way can be characterised by IR and NMR spectroscopy.

4) Preparation of the tin precursor
hydroxo[2-(methoxyimino)propanoate]tin

Sodium hydrogencarbonate (7.56 g, 90 mmol) is added in small portions with stirring to a solution of sodium pyruvate (9.90 g, 90 mmol) and methoxylamine hydrochloride (7.53 g, 90 mmol) in 100 ml of water. When the visible evolution of gas is complete, the mixture is stirred for a further 30 min. The mixture is subsequently evaporated to complete dryness in a rotary evaporator. A solution of anhydrous tin(II) chloride pentahydrate (7.88 g, 22.5 mmol) in 250 ml of methanol is added to the white powder obtained in this way, and the mixture is stirred for 2 hours. The solution is filtered and evaporated to dryness in a rotary evaporator. The residue is taken up in 100 ml of acetone or dimethoxyethane, and the suspension obtained in this way is re-filtered. The product is subsequently precipitated from the filtrate using copious diethyl ether, filtered off and dried in a desiccator.

5) Bis[2-(hydroxyimino)propanoato]zinc (by J. J. Schneider et al. *Advanced Materials* (2008) 20, 3383-3387) Tetraethylammonium bicarbonate (22.94 g, 120 mmol) is added in small portions to a solution of pyruvic acid (5.28 g, 60 mmol) and methoxylamine hydrochloride (5.02 g, 60 mmol) in 20 ml of water. After the termination of visible gas evolution the solution is stirred for another two hours. Then $Zn(NO_3)_2 \cdot 6H_2O$ (8.92 g, 30 mmol) is added, the mixture is stirred for another 4 h and then cooled to 5° C. The resulting white precipitate is filtered off and recrystallized from hot water.

Preparation of Solutions Containing Precursors

In device examples 1 and 2 solutions of 0.1 mmol/ml of bis- or tris-[2-(oxyimino)propanoato]metal in DMF are used (Solution A). A solution of 0.4 mmol/ml selenourea (solution B) or of 0.8 mmol/ml selenourea (solution D) is used as a chalcogen source unless reported differently.

Dip Coating:
Drawing speed ~1 mm/sec. The substrates employed are 76×26 mm glass plates.

Spin Coating:
For the spin coating, 150-350 μl of solution are applied to the substrate. The substrates used are 25×25 mm glass, optionally with coated with molybdenum. The parameters selected for duration and speed are 10 s at a preliminary speed of 1500 rpm and 20 s at the final speed of 2500 rpm.

Spray Coating:
For the spray coating Iwata Eclipse HP-CS air brush with a 0.35 mm needle/nozzle combination is used. The spraying of the precursor is done at 60 psi pressure of nitrogen gas. Ultrasonic spray and other commonly available spray equipments can also be used for spraying these precursors. To obtain a film free of defects like pin holes, spray parameters such as distance between spray nozzle to the substrate, gas pressure and/or the precursor flow rate may be optimized.

Device Example 1: Construction of a Photovoltaic Device where the CIS Absorber is Made by Spin Coating the Precursors Followed by Annealing the Films:

Solution A here contained bis[2-(hydroxyimino)propanoato]copper with two water molecules of hydration and tris[2-(methoxyimino)propanoato]indium. For spin coating the film, 150 μL of solutions A and B is freshly mixed and immediately spin coated at 1000 rpm on either 1"×1" glass or molybdenum-coated glass substrate. Then the substrate is annealed at 300° C. for 30 seconds. 8-10 multiple layers are processed this way and finally the film is annealed for 350° C. for 2 min. The film thickness is <100 nm as measured by surface profilometer. FIG. 1 shows the XRD of the CIS film on glass revealing a clean chalcopyrite CIS phase. The SEM image of film surface showed a CIS grain size of 5-20 nm.

In order to complete the photovoltaic device a layer of CdS (~60 nm) is deposited by a solution method described elsewhere (M. A. Contreras et al. Thin Solid Films 2002, 403-404, 204-211). ZnO (60 nm) and ITO (300 nm) thin films are deposited sequentially by RF sputtering.

FIG. 2 shows the photovoltaic device graphs with IV characteristics under dark and AM1.5 light condition. The device characteristics are as follows:
PCE=0.508%,
FF=0.329,
$V_{OC}$=218 mV,
$J_{SC}$=7.082 mA/cm2.

Device Example 2: Construction of Photovoltaic Device where the CIS Absorber Layer is Made by Spray Pyrolysis of the Precursors:

Solution A here contains bis[2-(hydroxyimino)propanoato]copper with two water molecules of hydration and tris[2-(methoxyimino)propanoato]indium. The solutions A and B are mixed and immediately spray coated in nitrogen environment over a glass or Mo coated glass substrate kept at 300° C. The spray coating is done for 5 min followed by annealing step at 350° C. for 10 min.

In order to complete the photovoltaic device a layer of CdS (~60 nm) is deposited by a solution method (see above). ZnO (60 nm) and ITO (300 nm) thin films are deposited sequentially by RF sputtering. Then the overall device is annealed at 200° C. for 10 min in air. SEM image of cross-section of 0.5 μm thick CIS film on glass showed grain sizes of 5-20 nm.

FIG. 3 shows the photovoltaic device response with IV characteristics under dark and AM1.5 light condition. The device characteristics measured are as follows:
PCE=0.247%,
FF=0.313,
$V_{OC}$=382 mV,
$J_{SC}$=2.063 mA/cm2

Device Example 3: Spray Pyrolysis of the Precursors and Selenization of the Film:

In this example we demonstrate use of high temperature selenization in presence of excess Se vapor to improve grain size and crystallinity of the films and evaluate the PV response. A first solution C contains 4 ml DMF with 0.098 mmol of bis[2-(hydroxyimino)propanoato]copper.$2H_2O$, 0.1 mmol tris[2-(methoxyimino)propanoato]indium. Solution D here contains 0.8 mmol/ml of selenourea in DMF. 4 ml of solution C and 0.5 ml of solution D are mixed and immediately spray coated in nitrogen environment over a Mo coated substrate kept at 370° C. The spray coating is performed for about 15 min at 20 psi in this case to make a thick film (~2.5 μm). The substrate is moved to an enclosed graphite box with a few selenium shots. The graphite is kept in a quartz tube with inert argon environment. The quartz tube is inserted in a tube furnace maintained at 550° C. and selenization is performed for 60 min. During the selenization process, selenium pellets create selenium vapor over the substrate inside the enclosed graphite box.

FIG. 4 shows (a) the XRD spectrum of a CIS film as sprayed and (b) a CIS film after selenization. The sprayed CIS film shows broad chalcopyrite peaks showing small grain size of 16 nm (calculated from line broadening of (112) peak via Debye-Scherrer formula). A molybdenum peak from the substrate is also observed. For the selenized sample the (112) peak is much narrower indicating significant grain growth.

Low intensity (101) and (211) peaks are also visible confirming the chalcopyrite CIS structure and improved crystallinity upon selenization. Broad molybdenum selenide peaks are also observed in the selenized sample due to the reaction of selenium vapor with the molybdenum substrate.

FIG. 5 shows a SEM image of the selenized film showing large well faceted grains of up to 1 µm in size confirming grain growth.

After selenization films are treated with 10 wt % potassium cyanide solution for 2 min to remove any residual copper selenide phase on the surface of the film. In order to complete the photovoltaic device a layer of CdS (~60 nm) is deposited by a solution method (see above). ZnO (60 nm) and ITO (300 nm) thin films are deposited sequentially by RF sputtering. Silver grids are hand-painted with commercially available silver paint on the devices.

The silver paint covered about 15% of the active device area. The total active device area is 16.5 $mm^2$. The completed devices are annealed in air at 165° C. for 2 min to improve device performance.

FIG. 6 shows the photovoltaic device response with IV characteristics under dark and AM1.5 light condition. The device characteristics are as follows:
PCE=3.76%
FF=0.36
Voc=0.337 V
Jsc=30.7 $mA/cm^2$ The above device characteristics are based on values without correction for the light blocked by hand painted silver grid area (~15%). The device efficiency is 4.42% after the silver paint area correction. The observed current and efficiency is much higher than non-selenized device examples 1 and 2. The improved efficiency value of 4.42% is due to much higher current value as a result of reduced recombination losses upon improving crystallinity and increasing grain size. It is expected that upon improvement of sprayed film quality, optimization of selenization condition, and optimization of other device layers efficiency could be further improved significantly.

Device Example 4: Spray Pyrolysis of the Precursors for a CIGS Film and Rapid Thermal Annealing:

In this example we demonstrate grain growth by high temperature annealing in absence of any excess chalcogen vapor using a rapid thermal annealing (RTA) process. In this example oximato precursors are mixed with commercially available precursors to demonstrate the versatility of oximato precursors as they could be mixed with several other classes of precursors like acetylacetonates, acetates etc. Solution E contains 4 ml DMF with 0.098 mmol of bis[2-(hydroxyimino)propanoato]copper.$2H_2O$, 0.07 mmol indium acetylacetonate (commercially available, Sigma Aldrich) and 0.03 mmol gallium acetylacetonate (commercially available, Sigma Aldrich). 4 ml of solution E and 0.5 ml of solution D (0.8 mmol/ml selenourea solution) are mixed and immediately spray coated in nitrogen environment over a Mo coated substrate kept at 300° C. The spray coating is performed for about 15 min at 20 psi in this case in order to make a thick film (~2.5 µm). The films are subjected to RTA at 550° C. for 10 min using halogen lamps in an inert Argon atmosphere.

FIG. 4 shows XRD of as sprayed CIGS film (c) and CIGS film after RTA (d). The sprayed film shows peak for molybdenum substrate and broad chalcopyrite peaks showing small grain size of 6 nm (calculated from line broadening of (112) peak via Debye-Scherrer formula). After RTA sample (112) peak is much narrower indicating grain growth >55 nm. Low intensity (101) and (211) peaks are also visible confirming the chalcopyrite CIGS structure and improved crystallinity.

After RTA films are treated with 10 wt % KCN solution for 2 minutes to remove any copper selenide phase on the surface. In order to complete the photovoltaic device a layer of CdS (~60 nm) is deposited from a solution method (see above). ZnO (60 nm) and ITO (300 nm) thin films are deposited sequentially by RF sputtering. Silver grids are hand painted with commercially available silver paint on the finished devices. The silver paint covers about 15% of the active device area. The total active device area is 16.5 $mm^2$. The completed devices are annealed in air at 165° C. for 2 min to improve device performance further.

FIG. 7 shows the photovoltaic device response with IV characteristics under dark and AM1.5 light condition. The device characteristics are as follows:
PCE=1.53%
FF=0.48
Voc=0.318 V
Jsc=10.12 $mA/cm^2$ The above device characteristics are based on values without correction for the light blocked by hand painted silver grid area (~15%). The device efficiency is 1.8% after the silver paint area correction. The efficiency of 1.8% in device example 4 is higher than 1 and 2 due to improved current value, crystallinity and grain size. However, efficiency value for device example 4 (1.8%) is lower than device example 3 (4.42%) due to relatively smaller grain size resulting in lower current value for device example 3. It is expected that upon improvement of sprayed film quality, optimization of rapid thermal annealing time/temperature, and optimization of other device layers efficiency could be further improved significantly.

DESCRIPTION OF DRAWINGS

The invention will be more fully explained and illustrated by the above description and examples when taken in conjunction with the accompanying drawings (FIGS. 1 to 7).

c) CIGS film sprayed at 300° C. according to device example 4 showing a chalcopyrite Cu(InGa)Se$_2$ phase and a peak from the molybdenum substrate.

d) CIGS film after RTA according to device example 4 showing highly crystalline chalcopyrite Cu(InGa)Se$_2$, and molybdenum peaks. Narrowing of (112) peak shows grain growth after RTA at 550° C.

a to d) As compared to CIS peaks (a and b), CIGS peaks (c and d) are slightly shifted to higher 2θ due to incorporation of gallium.

Figure 1:
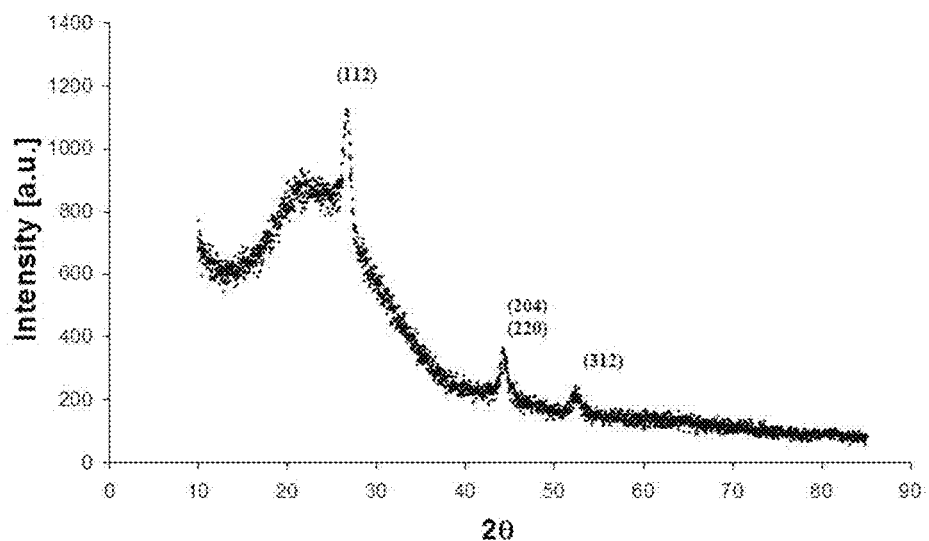
FIG. 1: The graph shows an X-ray diffraction pattern (intensity plotted against diffraction angle 2 theta) of a film according to the invention comprising CIS deposited according to Device Example 1. The XRD pattern shows that, besides the background due to amorphous glass substrate, $CuInSe_2$ is present as the only crystalline phase peaks. Crystalline impurities are below the detection limit of about 2% by weight. The average crystallite size can be calculated as about 12 nm from the line broadening which is typical of a nanocrystalline material via the Debye-Scherrer formula.
Figure 2:
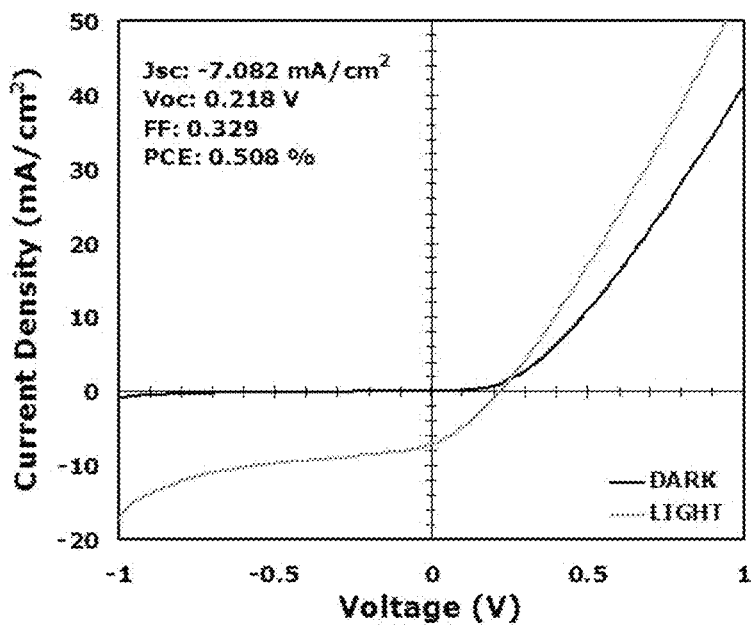
FIG. 2: The graph shows the photovoltaic device response with IV characteristics under dark and AM1.5 light condition (IEC 904-3 (1989), part III). The device is described in Device Example 1.
Figure 3:
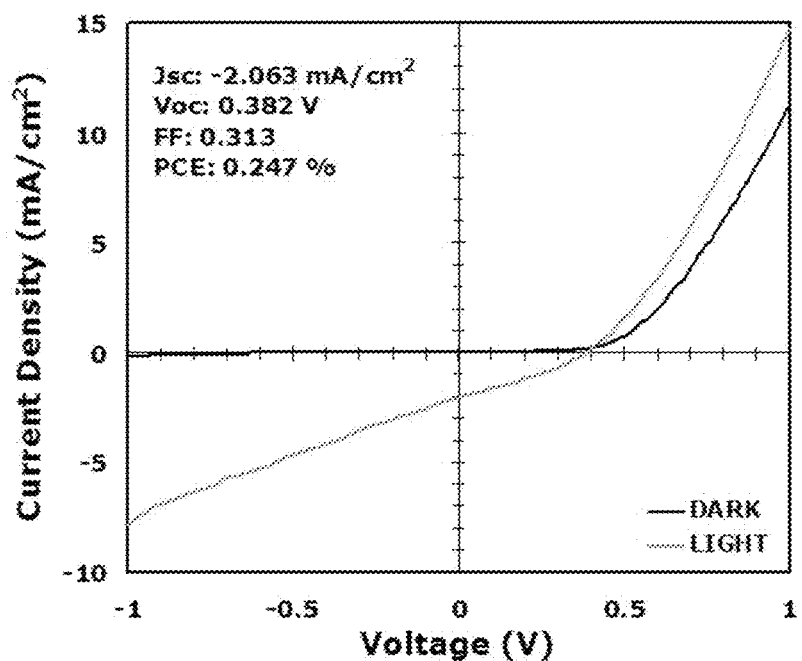
FIG. 3: The graph shows the photovoltaic device response with IV characteristics under dark and AM1.5 light condition. The device is described in Device Example 2.
Figure 4:
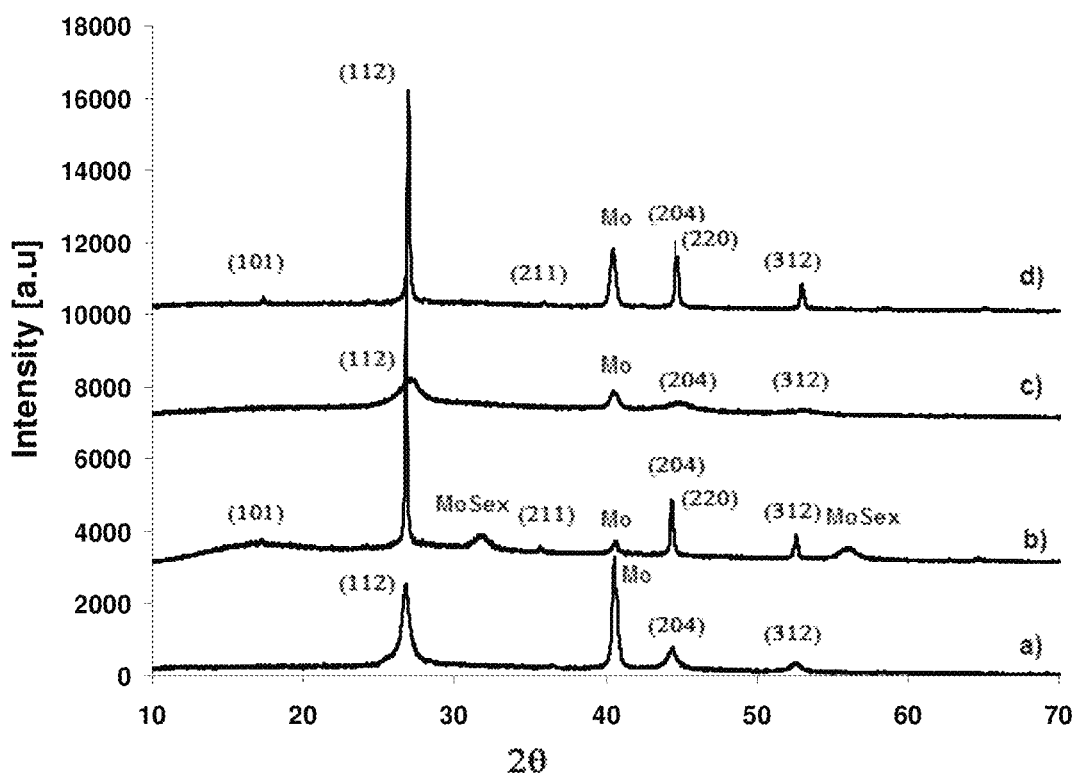
FIG. 4: The graphs shows X-ray diffraction patterns (intensity plotted against diffraction angle 2 theta) of films according to the invention comprising (a, b) CIS deposited according to Device Example 3 and (c, d) CIGS according to Device Example 4:
a) CIS film sprayed at 370° C. according to device example 3 showing chalcopyrite $CuInSe_2$ peaks and peak from molybdenum substrate.
b) CIS film after selenization according to device example 3 showing highly crystalline chalcopyrite $CuInSe_2$, molybdenum selenide and molybdenum peaks. Narrowing of (112) peak shows grain growth upon selenization at 550° C.
Figure 5:
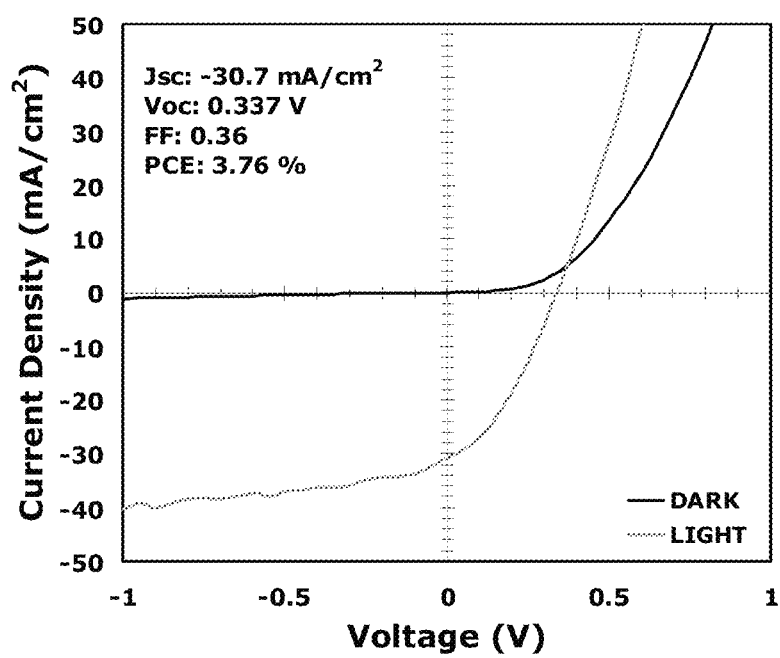

FIG. 5: The graph shows the photovoltaic device response with IV characteristics under dark and AM1.5 light condition. The device is described in Device Example 3. The PCE for this device is 3.76% (before silver paint grid area correction) and 4.42% (after silver paint grid area correction).

Figure 6:
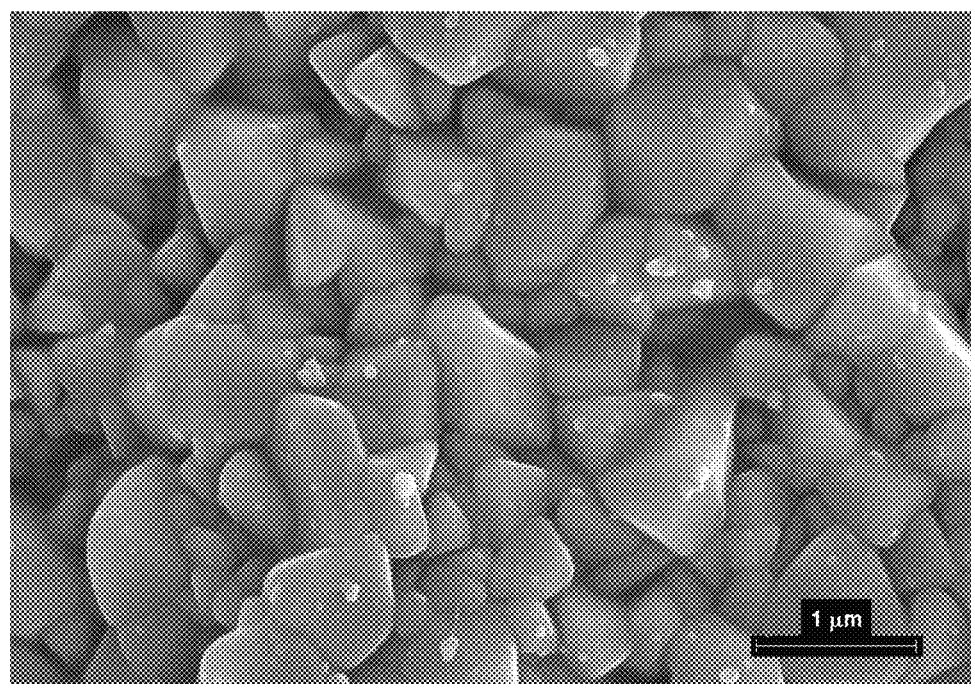

FIG. 6: The picture shows a SEM image of the selenized film made in Device Example 3 showing large well faceted CuInSe$_2$ grains of up to 1 μm in size.

Figure 7:
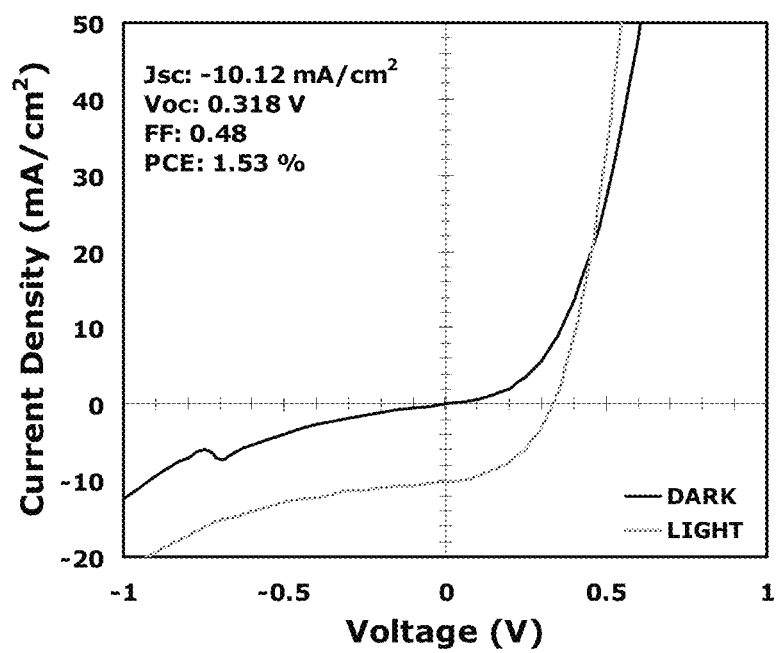

FIG. 7: The graph shows the photovoltaic device response with IV characteristics under dark and AM1.5 light condition of a CIGS film. The device is described in Device Example 4. The PCE for this device is 1.53% (before silver paint grid area correction) and 1.8% (after silver paint grid area correction).

The invention claimed is:

1. A process for preparing a semiconductor, comprising
   a. combining precursors comprising one or more metal complexes and a chalcogen source,
   wherein the chalcogen is Se, S or Te,
   wherein at least one metal complex comprises one or more ligands from the class of oximates, and
   wherein the precursors comprise as metals in the metal complexes copper and/or indium and/or gallium, and
   b. the combined precursors are decomposed by heating and/or radiation with formation of the semiconductor.

2. A process according to claim 1, wherein the semiconductor is of the I-III-VI$_2$-type, of the I-VI-type, of the III-VI-type, of the III-VI-type, of the IV-VI-type, or of the I-II-IV-VI$_2$ type.

3. A process according to claim 1, wherein the semiconductor is formed as a film or layer on a substrate.

4. A process according to claim 1, wherein the combination of the precursors is effected in solution.

5. A process according to claim 1, wherein the combined precursors are decomposed in an inert environment.

6. A process according to claim 1, wherein the chalcogen is selenium (Se) or sulfur (S).

7. A process according to claim 1, wherein the chalcogen source comprises an organic selenium or sulfur compound or elemental selenium or sulfur.

8. A process according to claim 1, wherein the chalcogen source is one or more of selenourea or derivatives, thiourea or derivatives, thioacetamide, or selenium/sulfur dissolved in amines or phosphines.

9. A process according to claim 1, wherein the temperature for the decomposition is T≥80° C.

10. A process according to claim 1, further comprising a selenization and/or sulfurization step and/or an annealing step after the decomposition of the precursors.

11. A process according to claim 1, wherein at least one metal complex precursor comprises copper.

12. A process according to claim 1, wherein at least one metal complex precursor comprises indium or gallium.

13. A process for preparing a thin film photovoltaic device comprising a semiconductor, comprising incorporating the semiconductor made by a process according to claim 1 into said thin film photovoltaic device.

* * * * *